US008841669B2

(12) United States Patent
Jung et al.

(10) Patent No.: US 8,841,669 B2
(45) Date of Patent: Sep. 23, 2014

(54) FLAT PANEL DISPLAY DEVICE AND METHOD OF MANUFACTURING THE SAME

(75) Inventors: Jin-Goo Jung, Yongin (KR); Deok-Hoi Kim, Yongin (KR); Seung-Gyu Tae, Yongin (KR); Yu-Bong Won, Yongin (KR); Sung-Woo Jung, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 596 days.

(21) Appl. No.: 13/114,976

(22) Filed: May 24, 2011

(65) Prior Publication Data

US 2011/0297945 A1 Dec. 8, 2011

(30) Foreign Application Priority Data

Jun. 3, 2010 (KR) .................. 10-2010-0052361

(51) Int. Cl.
*H01L 31/00* (2006.01)
(52) U.S. Cl.
USPC ............................................ 257/59; 438/34
(58) Field of Classification Search
USPC ............... 257/49, 59, 66–72, 43, 40, 57, 296, 257/347; 438/149, 34–35, 104, 158, 99, 438/151, 154, 164, 28, 46, 60
See application file for complete search history.

(56) References Cited

U.S. PATENT DOCUMENTS 5,834,328 A 11/1998 Jang
2008/0283841 A1 11/2008 Yamayoshi
2009/0227054 A1* 9/2009 Cheng .............................. 438/30
2009/0278131 A1* 11/2009 Kwon et al. ..................... 257/72
2011/0122330 A1 5/2011 Tae et al.

FOREIGN PATENT DOCUMENTS

| CN | 101165908 A | 4/2008 |
|---|---|---|
| KR | 1997-0076033 | 12/1997 |
| KR | 10-2003-0004782 A | 1/2003 |
| KR | 10-2008-0049256 A | 6/2008 |
| KR | 10-2009-0057689 A | 6/2009 |
| KR | 10-2011-0057062 | 5/2011 |

* cited by examiner

*Primary Examiner* — Julio J Maldonado
*Assistant Examiner* — Robert Bachner
(74) *Attorney, Agent, or Firm* — Christie, Parker & Hale, LLP

(57) ABSTRACT

A method of manufacturing a flat panel display device includes: forming a semiconductor layer of a thin film transistor (TFT) on a substrate; forming a gate electrode on the semiconductor layer with a gate insulating layer between the gate electrode and the semiconductor layer, and doping source and drain regions of the semiconductor layer with ion impurities; sequentially forming a first conductive layer, a first insulating layer, and a second conductive layer, and forming a capacitor at a distance away from the TFT by patterning the first conductive layer, the first insulating layer, and the second conductive layer; forming a second insulating layer, and forming contact holes passing through the second insulating layer, the contact holes exposing portions of the source and drain regions and the second conductive layer; and forming source and drain electrodes that respectively contact the source and drain regions and the second conductive layer through the contact holes.

13 Claims, 8 Drawing Sheets

FLAT PANEL DISPLAY DEVICE AND METHOD OF MANUFACTURING THE SAME

CROSS-REFERENCE TO RELATED PATENT APPLICATION

This application claims priority to and the benefit of Korean Patent Application No. 10-2010-0052361, filed on Jun. 3, 2010, in the Korean Intellectual Property Office, the disclosure of which is incorporated herein in its entirety by reference.

BACKGROUND

1. Field

Aspects of embodiments according to the present invention relate to a flat panel display device and a method of manufacturing the same.

2. Description of the Related Art

Flat panel display devices, e.g., organic light-emitting display devices and liquid crystal display (LCD) devices, are classified into active matrix flat panel display devices and passive matrix flat panel display devices. Active matrix flat panel display devices include a thin film transistor (TFT) and a capacitor in each pixel and display high-resolution images.

When a TFT and a capacitor are formed in each pixel, a wiring for connecting the TFT and the capacitor is formed in fine patterns in order to increase an aperture ratio. Such fine patterns are typically formed by photolithography using a photo-mask.

Photolithography involves uniformly coating a photoresist on a substrate, aligning a photo-mask, on which a pattern is formed, with the substrate, and exposing the photoresist by using an exposure device such as a stepper. If the photoresist is a positive photoresist, the photolithography further involves developing and etching the exposed photoresist to form a desired pattern, and removing the photoresist when the photoresist is no longer needed.

A series of processes for forming a pattern by using a photo-mask is complex as described above. As the number of processes using a photo-mask increases, manufacturing costs and manufacturing time increase.

SUMMARY

Embodiments of the present invention are directed toward a flat panel display device that may reduce the number of processes using a photo-mask and increase an aperture ratio, and a method of manufacturing the flat panel display device.

According to an embodiment of the present invention, there is provided a method of manufacturing a flat panel display device, the method including: forming a semiconductor layer of a thin film transistor (TFT) on a substrate; forming a gate electrode on the semiconductor layer with a gate insulating layer between the gate electrode and the semiconductor layer, and doping source and drain regions of the semiconductor layer with ion impurities; sequentially forming a first conductive layer, a first insulating layer, and a second conductive layer, and forming a capacitor at a distance away from the TFT by patterning the first conductive layer, the first insulating layer, and the second conductive layer; forming a second insulating layer, and forming contact holes passing through the second insulating layer, the contact holes exposing portions of the source and drain regions and the second conductive layer; and forming source and drain electrodes, the source electrode contacting the source region and the drain electrode contacting the drain region and the second conductive layer through the contact holes.

The forming of the gate electrode may include forming a wiring on the gate insulating layer on which the gate electrode is formed, the wiring comprising a same material as that of the gate electrode and directly contacting the first conductive layer.

The doping of the source and drain regions of the semiconductor layer with the ion impurities may include doping the source and drain regions with same ion impurities.

The doping of the source and drain regions of the semiconductor layer with the ion impurities may include doping the source and drain regions with the ion impurities by using the gate electrode as a self-aligned mask.

Each of the first conductive layer and the second conductive layer may include a transparent conductive material.

Portions of the first conductive layer, the first insulating layer, and the second conductive layer where the TFT is formed may be completely etched.

The forming of the capacitor may include patterning the first conductive layer, the first insulating layer, and the second conductive layer so that etched side surfaces of the first conductive layer, the first insulating layer, and the second conductive layer are aligned.

The second insulating layer may directly contact the gate electrode.

The method may further include forming an organic layer on the source and drain electrodes, and forming a via-hole passing through the organic layer, the via-hole exposing a portion of one of the source and drain electrodes.

The method may further include forming a pixel electrode contacting one of the source and drain electrodes through the via-hole.

According to another embodiment of the present invention, there is provided a flat panel display device including: a semiconductor layer of a TFT on a substrate, the semiconductor layer including a channel region, a source region, and a drain region; a gate electrode on the channel region with a gate insulating layer between the gate electrode and the channel region; a capacitor on the gate insulating layer and including a first conductive layer, a first insulating layer, and a second conductive layer of which etched side surfaces are aligned; source and drain electrodes passing through a second insulating layer on the gate electrode and the capacitor, the source electrode contacting the source region and the drain electrode contacting the drain region and the second conductive layer; and a pixel electrode contacting a portion of one of the source and drain electrodes.

The source and drain regions may include same ion impurities.

The flat panel display device may further include a wiring formed of a same material as that of the gate electrode, the wiring being on the gate insulating layer on which the gate electrode is formed and directly contacting the first conductive layer.

The wiring may include at least one conductive material selected from the group consisting of silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), molybdenum (Mo), titanium (Ti), tungsten (W), molybdenum tungsten (MoW), aluminum/copper (Al/Cu), and combinations thereof.

Each of the first conductive layer and the second conductive layer of the capacitor may include a transparent conductive material.

The transparent conductive material may include at least one material selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

The first insulating layer may include a material having a dielectric constant higher than that of the second insulating layer.

The first insulating layer may include a nitride.

The first insulating layer may be only between the first conductive layer and the second conductive layer.

The flat panel display device may further include an organic layer between the source and drain electrodes and the pixel electrode, wherein one of the source and drain electrodes contacts the pixel electrode through a via-hole in the organic layer.

The flat panel display device may further include a counter electrode facing the pixel electrode, and a liquid crystal layer between the pixel electrode and the counter electrode.

The flat panel display device may further include a wiring formed of a same material as that of the gate electrode, the wiring being on the gate insulating layer on which the gate electrode is formed and directly contacting the first conductive layer, wherein the wiring is for receiving a voltage Vcom.

The flat panel display device may further include a counter electrode facing the pixel electrode, and an organic light-emitting layer between the pixel electrode and the counter electrode.

BRIEF DESCRIPTION OF THE DRAWINGS

The above and other features and aspects of embodiments according to the present invention will become more apparent by describing in detail exemplary embodiments thereof with reference to the attached drawings in which.

DETAILED DESCRIPTION

The present invention will now be described more fully with reference to the accompanying drawings, in which exemplary embodiments of the invention are shown.

Figure 1A:
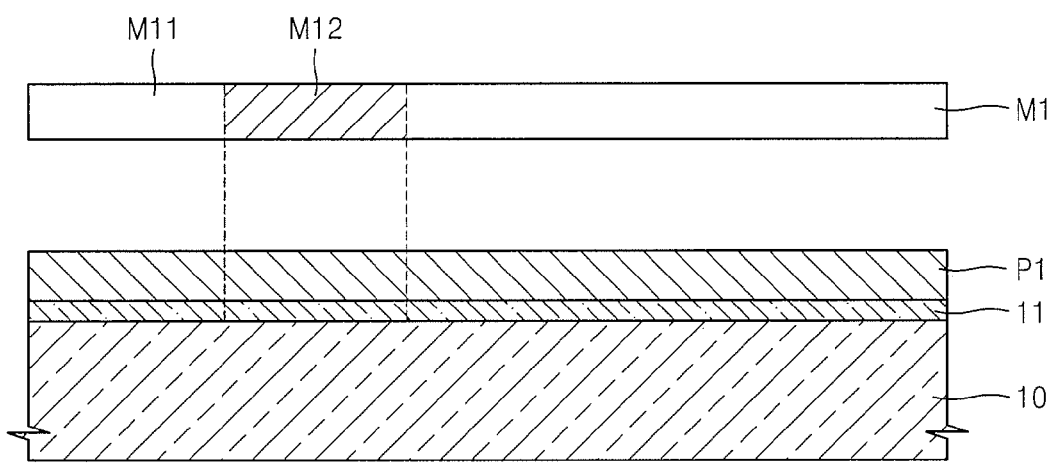
FIGS. 1A and 1B are cross-sectional views illustrating a first mask process of a method of manufacturing a flat panel display device, according to an embodiment of the present invention.
Figure 1B:
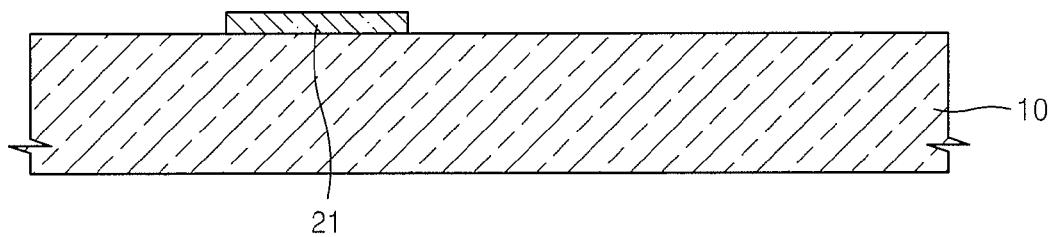

FIGS. 1A and 1B are cross-sectional views illustrating a first mask process of a method of manufacturing a flat panel display device, according to an embodiment of the present invention.

Referring to FIG. 1A, a material layer 11 that is to become a material for a semiconductor layer is deposited on a substrate 10, a first photoresist P1 is coated on the material layer 11, and a first photo-mask process using a first photo-mask M1 is performed.

The substrate 10 may be formed of a transparent glass material including $SiO_2$ as a main component. A buffer layer including $SiO_2$ and/or SiNx may be further disposed on the substrate 10 in order to planarize the substrate 10 and prevent penetration of impurity elements.

The buffer layer and the material layer 11 may be deposited by various suitable deposition methods, such as plasma enhanced chemical vapour deposition (PECVD), atmospheric pressure CVD (APCVD), low pressure CVD (LPCVD), or other suitable methods.

In one embodiment, the material layer 11 may be formed of amorphous silicon or polysilicon. Polysilicon may be formed by crystallizing amorphous silicon. Examples of a method of crystallizing amorphous silicon may include rapid thermal annealing (RTA), solid phase crystallization (SPC), excimer laser annealing (ELA), metal induced crystallization (MIC), metal induced lateral crystallization (MILC), sequential lateral solidification (SLS) or other suitable methods.

The first mask process is performed using the first photo-mask M1 including light-transmitting portions M11 and light-blocking portions M12. The first photo-mask M1 is exposed by using an exposure device, and a series of processes of developing, etching, and stripping or washing are performed.

Referring to FIG. 1B, the material layer 11 is patterned into a semiconductor layer 21 of a thin film transistor (TFT) 20 (see FIG. 5B), as a result of the first mask process.

Figure 2A:
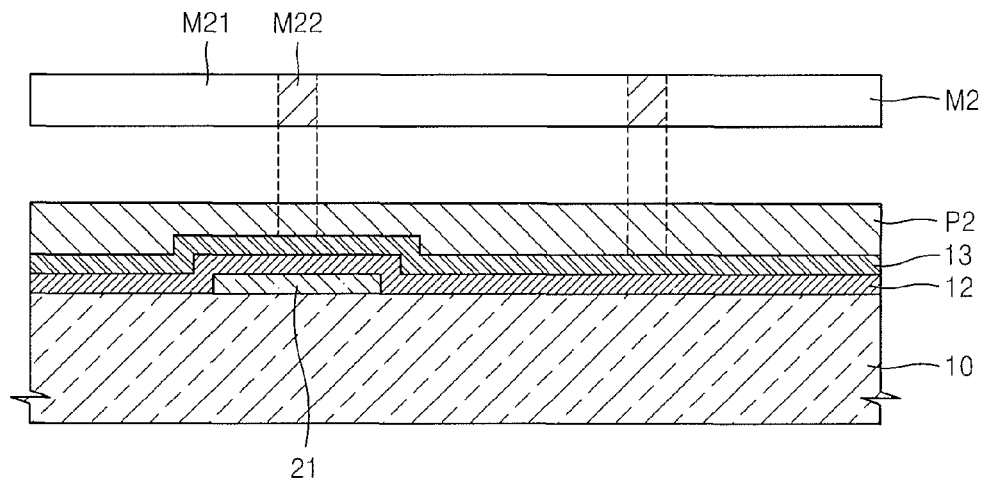
FIGS. 2A, 2B, and 2C are cross-sectional views illustrating a second mask process of the method of FIGS. 1A and 1B, according to an embodiment of the present invention.
Figure 2B:
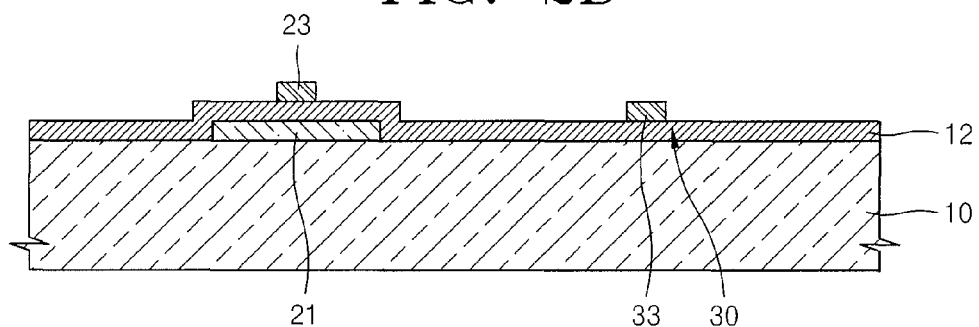
Figure 2C:
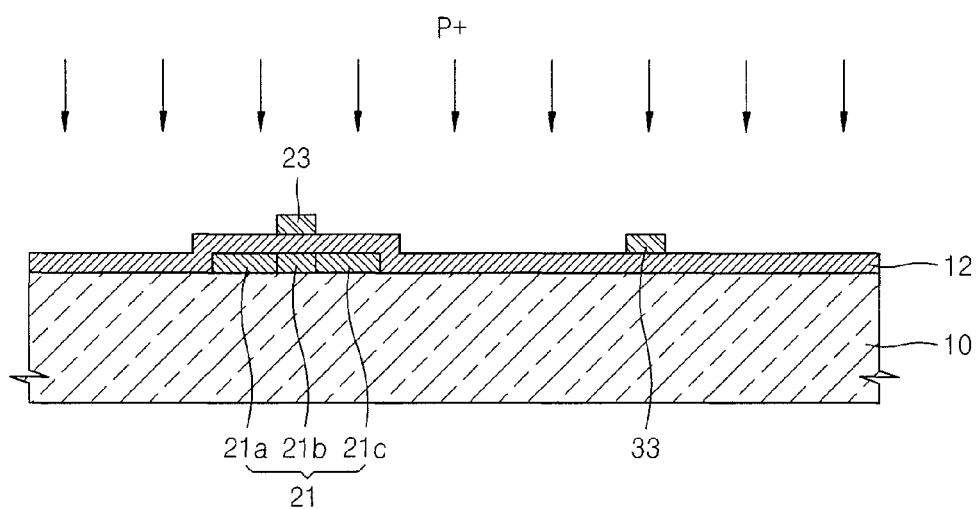

FIGS. 2A through 2C are cross-sectional views illustrating a second mask process of the method of FIGS. 1A and 1B, according to an embodiment of the present invention.

Referring to FIG. 2A, a gate insulating layer 12, a metal layer 13 that is to become a material for a gate electrode, and a second photoresist P2 are sequentially stacked in the stated order on the resultant structure of FIG. 1B, and the second mask process is performed using a second photo-mask M2 including light-transmitting portions M21 and light-blocking portions M22.

The gate insulating layer 12 may have a single-layer structure or a multi-layer structure including a silicon oxide, a silicon nitride, and so on.

The metal layer 13 may include at least one conductive material selected from the group consisting of silver (Ag), magnesium (Mg), aluminium (Al), platinum (Pt), palladium (Pd), gold (Au), nickel (Ni), neodymium (Nd), iridium (Ir), chromium (Cr), lithium (Li), calcium (Ca), molybdenum (Mo), titanium (Ti), tungsten (W), molybdenum tungsten (MoW), aluminium/copper (Al/Cu), and combinations thereof.

Referring to FIG. 2B, the metal layer 13 is patterned to form a gate electrode 23 of the TFT 20 and a wiring 33 of a capacitor 30 that will be explained in more detail later, as a result of the second mask process. Since the wiring 33 of the capacitor 30 and the gate electrode 23 of the TFT 20 are formed of the same material on the same layer, that is, on the gate insulating layer 12, the wiring 33 may be formed without additionally performing a separate mask process.

Referring to FIG. 2C, the semiconductor layer 21 includes a channel region 21b corresponding to the gate electrode 23, and source and drain regions 21a and 21c formed adjacent to the channel region 21b.

In one embodiment, the source and drain regions 21a and 21c are doped with the same ion impurities by using the gate electrode 23, which is formed as a result of the second mask process, as a self-aligned mask.

Although the source and drain regions 21a and 21c are doped with P+type impurities in the second mask process described with reference to FIG. 2C, the embodiments of the present invention are not limited thereto. That is, the source and drain regions 21a and 21c may be doped with N+, P−, or N− impurities, like in a P-channel metal oxide semiconductor (PMOS) TFT or N-channel metal oxide semiconductor (NMOS) TFT, not a complementary metal oxide semiconductor (CMOS) TFT.

A conventional method of forming a CMOS TFT includes at least two mask processes. However, according to the present embodiment, since the source and drain regions 21a and 21c are doped with the same ion impurities by using the gate electrode 23 as a self-aligned mask, an additional mask process is not necessary. Thus, the number of mask processes is reduced, and manufacturing costs are reduced.

Figure 3A:
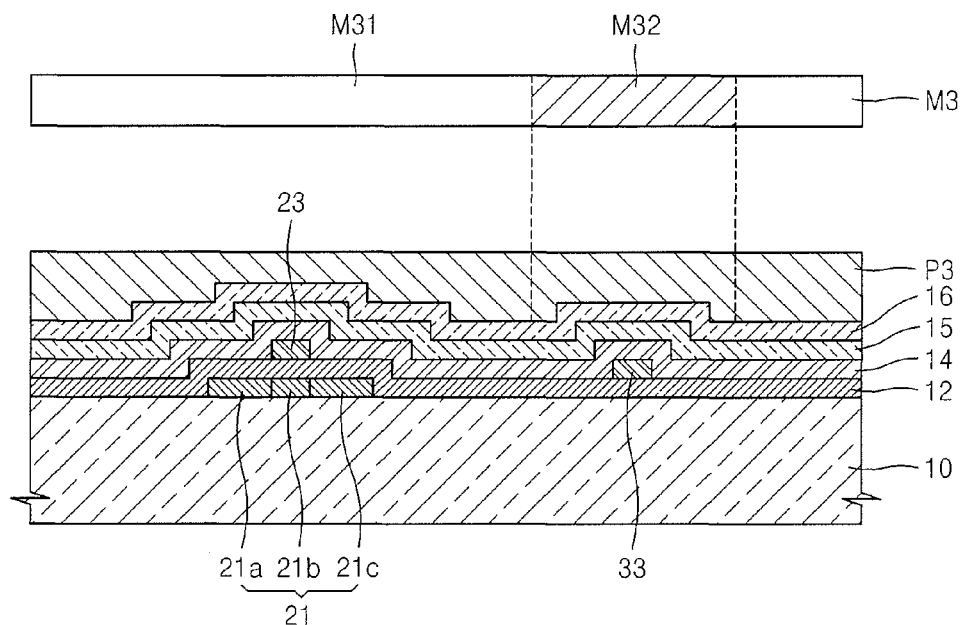
FIGS. 3A, 3B, 3C, 3D, and 3E are cross-sectional views illustrating a third mask process of the method of FIGS. 1A and 1B, according to an embodiment of the present invention.

FIGS. 3A through 3E are cross-sectional views illustrating a third mask process of the method of FIGS. 1A and 1B, according to an embodiment of the present invention. Referring to FIG. 3A, a first conductive layer 14, a first insulating layer 15, a second conductive layer 16, and a third photoresist P3 are sequentially stacked in the stated order on the resultant structure of FIG. 2C, and the third mask process is performed using a third photo-mask M3 including light-transmitting portions M31 and light-blocking portions M32.

Figure 3B:
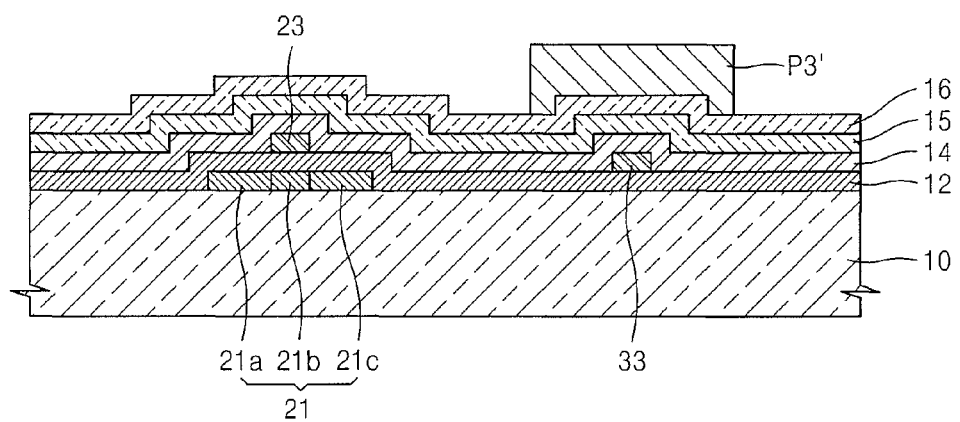

Referring to FIG. 3B, the third photoresist P3 is developed, and a third photoresist P3' corresponding to the light-blocking portion M32 remains on a portion of the second conductive layer 16.

Figure 3C:
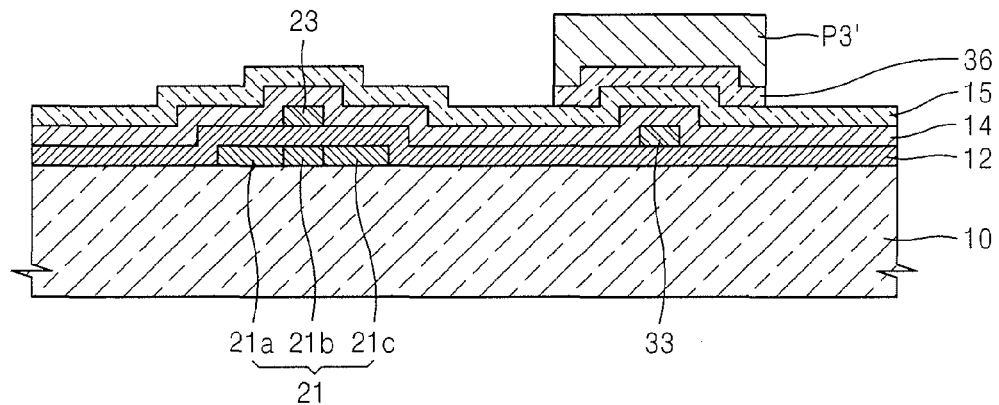
Figure 3D:
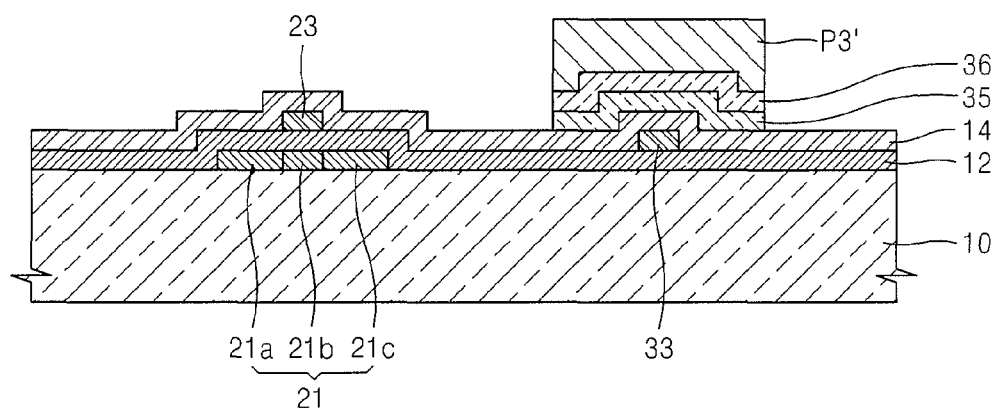
Figure 3E:
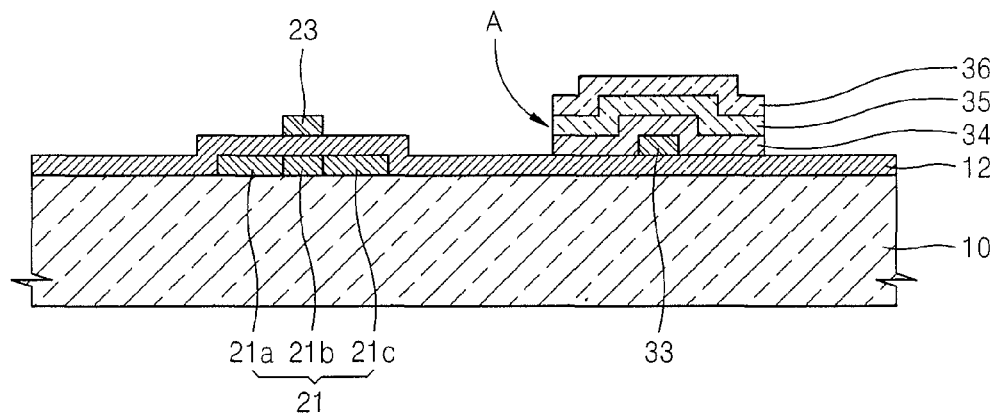

Referring to FIG. 3C, a portion of the second conductive layer 16 not covered by the third photoresist P3' corresponding to the light-blocking portion M32 is etched, and a portion of the second conductive layer 16 corresponding to the remaining third photoresist P3' remains as an upper electrode 36 of the capacitor 30 (see FIG. 3E).

Referring to FIG. 3D, a portion of the first insulating layer 15 not covered by the third photoresist P3' corresponding to the light-blocking portion M32 is etched, and a portion of the first insulating layer 15 corresponding to the remaining third photoresist P3' corresponding to the light-blocking portion M32 remains as a dielectric layer 35 of the capacitor 30 (see FIG. 3E).

Referring to FIG. 3E, a portion of the first conductive layer 14 not covered by the third photoresist P3' corresponding to the light-blocking portion M32 is etched, and a portion of the first conductive layer 14 corresponding to the remaining third photoresist P3' corresponding to the light-blocking portion M32 remains as a lower electrode 34 of the capacitor 30, and the third photoresist P3' corresponding to the light-blocking portion M32 is removed.

Since the lower electrode 34, the dielectric layer 35, and the upper electrode 36 of the capacitor 30 are etched by using the third photoresist P3' as a mask formed by one photo-mask, namely, the third photo-mask M3, etched side surfaces A of the capacitor 30 are aligned.

Each of the lower electrode 34 and the upper electrode 36 of the capacitor 30 may include a transparent conductive material. The transparent conductive material may be selected from the group consisting of indium tin oxide (ITO), indium zinc oxide (IZO), zinc oxide (ZnO), indium oxide ($In_2O_3$), indium gallium oxide (IGO), and aluminium zinc oxide (AZO). Since the upper electrode 36 and the lower electrode 34 of the capacitor 30 are transparent electrodes, the aperture ratio of the flat panel display device may be increased without reducing the size of the capacitor 30.

Also, the lower electrode 34 of the capacitor 30 may directly contact the wiring 33 of the capacitor 30. If each of the upper electrode 36 and the lower electrode 34 of the capacitor 30 is formed of a transparent electrode having high resistivity, and the wiring 33 is formed of a material having high resistivity, a voltage applied to the capacitor 30 should be increased. However, if the wiring 33 of the capacitor 30 is formed of a material having low resistivity, like a material used to form the gate electrode 23, a voltage applied to the capacitor 30 may be reduced. Furthermore, in the case of a liquid crystal display (LCD) device, a voltage Vcom should be additionally applied to the capacitor 30. In one embodiment, since a voltage Vcom is applied to the wiring 33 of the capacitor 30, which is formed of the same material as that of the gate electrode 23, a load due to wiring resistance may be minimized or reduced.

Also, the first insulating layer 15, formed into the dielectric layer 35 of the capacitor 30, may include an insulating material having a high dielectric constant. In one embodiment, the dielectric layer 35 includes a silicon nitride.

Here, although the second conductive layer 16, the first insulating layer 15, and the first conductive layer 14 are etched through different etching processes, that is, three etching processes, in FIGS. 3C through 3E, embodiments of the present invention are not limited thereto, and one or two etching processes may be performed.

Figure 4A:
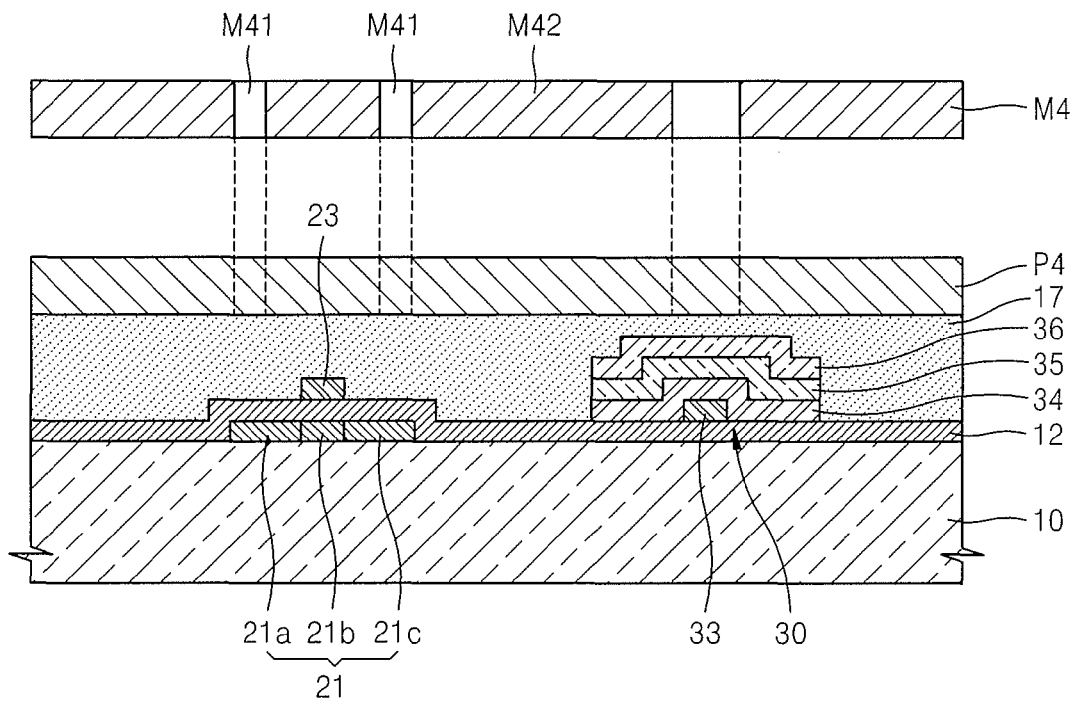
FIGS. 4A and 4B are cross-sectional views illustrating a fourth mask process of the method of FIGS. 1A and 1B, according to an embodiment of the present invention.
Figure 4B:
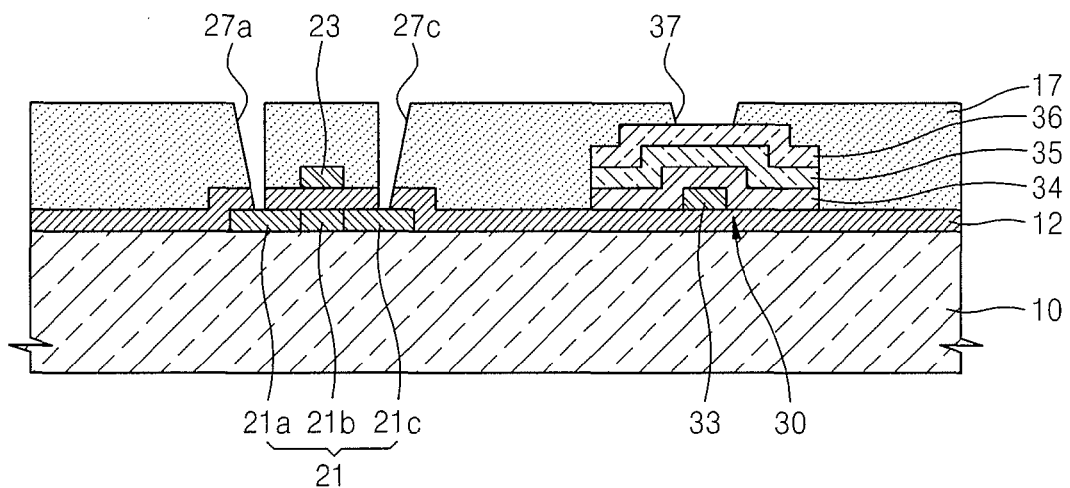

FIGS. 4A through 4B are cross-sectional views illustrating a fourth mask process of the method of FIGS. 1A and 1B, according to an embodiment of the present invention.

Referring to FIG. 4A, a second insulating layer 17 and a fourth photoresist P4 are sequentially stacked in the stated order on the resultant structure of FIG. 3E, and the fourth mask process is performed using a fourth photo-mask M4 including light-transmitting portions M41 and light-blocking portions M42.

Referring to FIG. 4B, contact holes 27a, 27c, and 37, which pass through the second insulating layer 17 and expose portions of the source and drain regions 21a and 21c of the TFT 20 and the upper electrode 36 of the capacitor 30, are formed, as a result of the fourth mask process.

Since the portion of the first insulating layer 15 where the TFT 20 is formed is completely etched in the third mask process, the second insulating layer 17 directly contacts the gate electrode 23 of the TFT 20.

The second insulating layer 17 is formed as an interlayer insulating layer that is directly interposed between the gate electrode 23 and source and drain electrodes 28a and 28c (see FIG. 5B) of the TFT 20.

The second insulating layer 17 may include a nitride or an oxide, and may be formed of a material having a dielectric constant less than that of the first insulating layer 15.

Figure 5A:
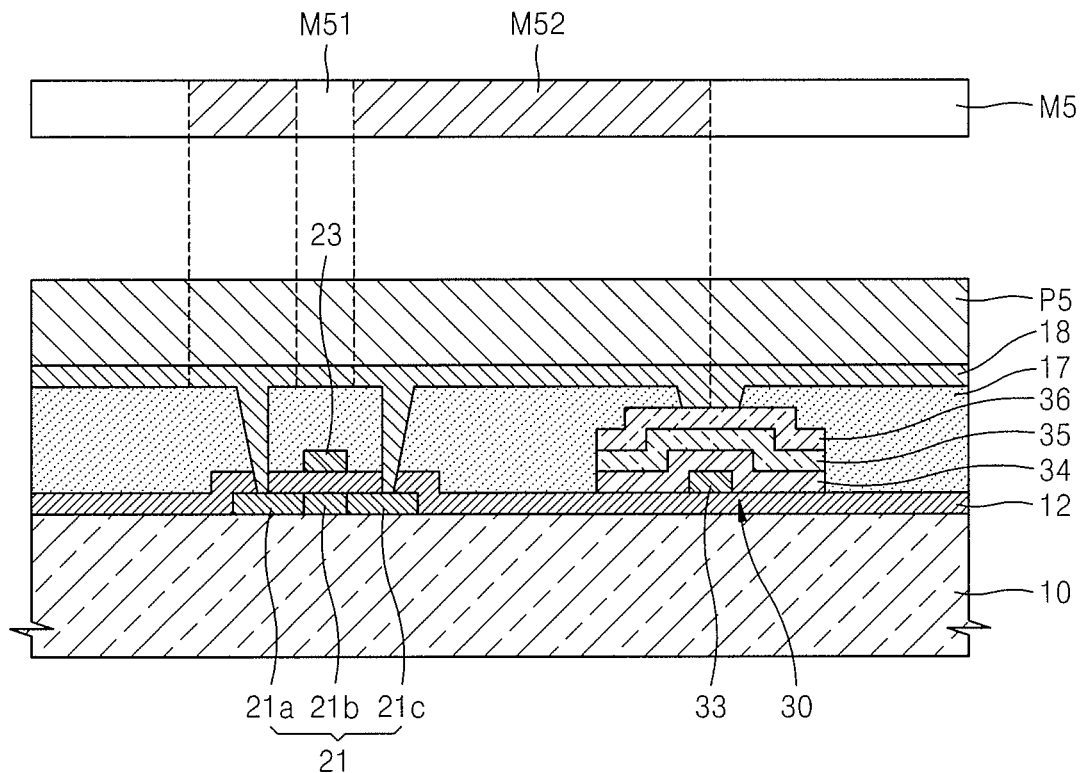
FIGS. 5A and 5B are cross-sectional views illustrating a fifth mask process of the method of FIGS. 1A and 1B, according to an embodiment of the present invention.
Figure 5B:
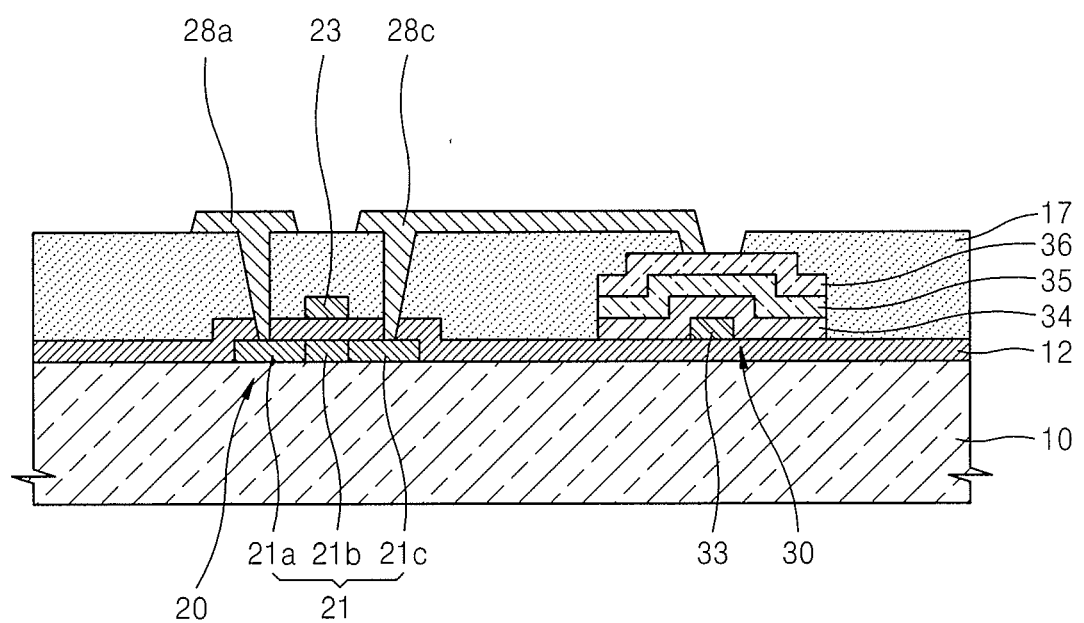

FIGS. 5A and 5B are cross-sectional views illustrating a fifth mask process of the method of FIGS. 1A and 1B, according to an embodiment of the present invention.

Referring to FIG. 5A, a material layer 18, which is to become a material for source and drain electrodes, and a fifth photoresist P5 are sequentially stacked in the stated order on the resultant structure of FIG. 4B, and the fifth mask process is performed using a fifth photo-mask M5 including light-transmitting portions M51 and light-blocking portions M52.

Referring to FIG. 5B, the source and drain electrodes 28a and 28c, which respectively contact the source and drain regions 21a and 21c of the TFT 20 and the upper electrode 36 of the capacitor 30 through the contact holes 27a, 27c, and 37 in the second insulating layer 17, are formed, as a result of the fifth mask process.

According to the above described embodiments, the TFT 20 and the capacitor 30 of the flat panel display device may be formed through five photo-mask processes. Accordingly, the number of mask processes and manufacturing costs are reduced.

Figure 6:
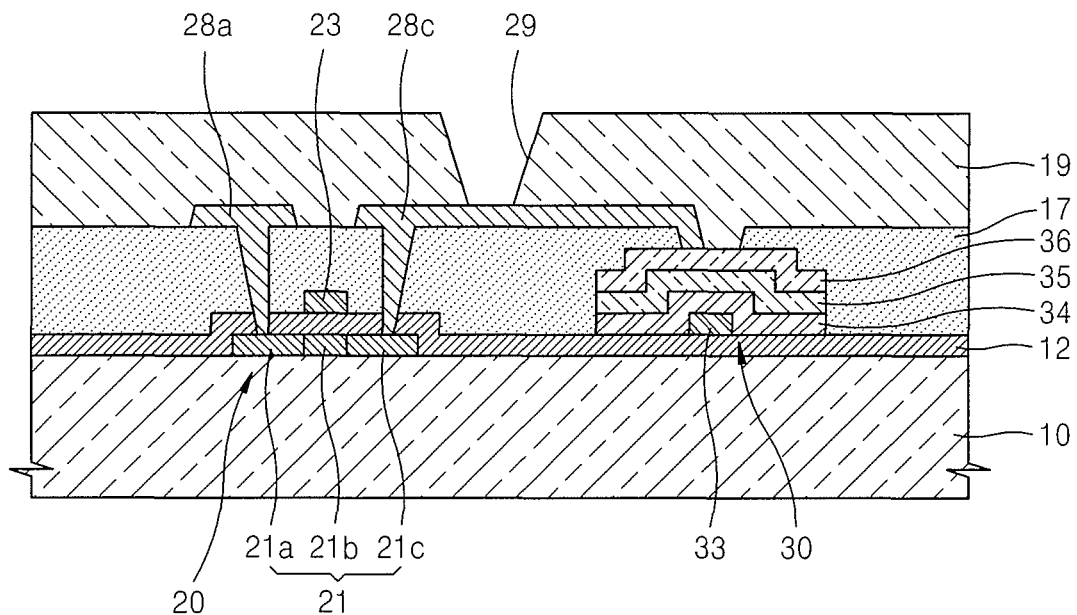
FIG. 6 is a cross-sectional view illustrating a sixth mask process of the method of FIGS. 1A and 1B, according to an embodiment of the present invention.

FIG. 6 is a cross-sectional view illustrating a sixth mask process of the method of FIGS. 1A and 1B, according to an embodiment of the present invention.

Referring to FIG. 6, an organic layer 19 is formed on the resultant structure of FIG. 5B. A via-hole 29 passing through the organic layer 19 and exposing a portion of one of the source and drain electrodes 28a and 28c is formed through the sixth mask process.

In one embodiment, an inorganic insulating layer may be further disposed between the source and drain electrodes 28a and 28c and the organic layer 19.

Figure 7:
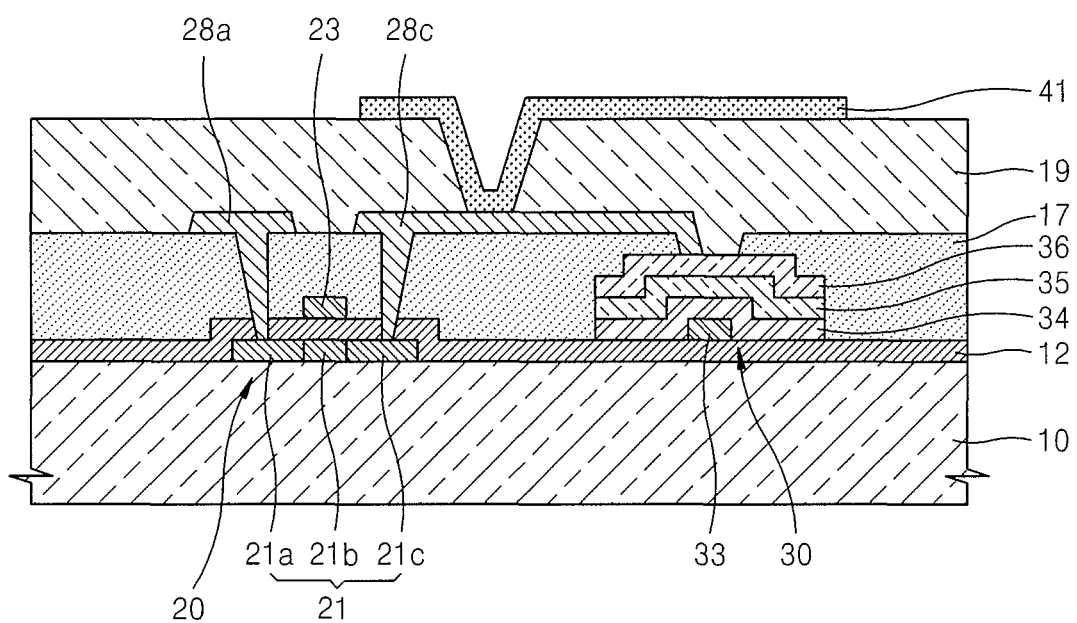
FIG. 7 is a cross-sectional view illustrating a seventh mask process of the method of FIGS. 1A and 1B, according to an embodiment of the present invention.

FIG. 7 is a cross-sectional view illustrating a seventh mask process of the method of FIGS. 1A and 1B, according to an embodiment of the present invention.

Referring to FIG. 7, a pixel electrode 41 is formed through the seventh mask process on the organic layer 19 in which the via-hole 29 is formed. The pixel electrode 41 is coupled to one of the source and drain electrodes 28a and 28c through the via-hole 29.

Figure 8:
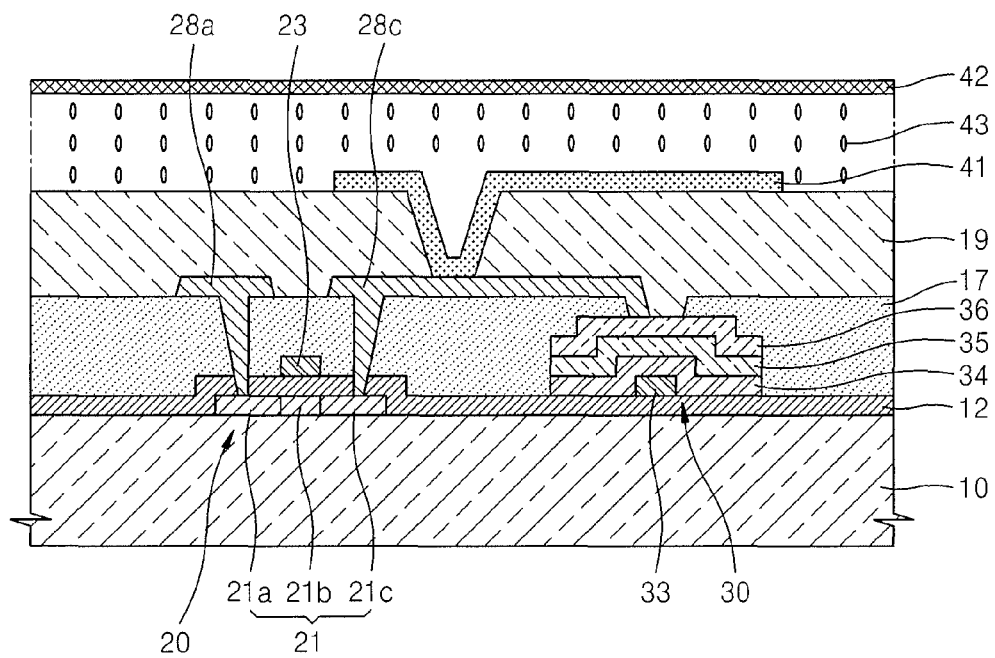
FIG. 8 is a cross-sectional view illustrating a liquid crystal display (LCD) device according to an embodiment of the present invention.

FIG. 8 is a cross-sectional view of an LCD device formed by the method of FIGS. 1A and 1B, according to an embodiment of the present invention. A liquid crystal layer 43 and a counter electrode 42 are formed on the substrate 10 including the pixel electrode 41.

The flat panel display device formed by the method as described above may include a TFT and a capacitor in a pixel through five photo-mask processes. Accordingly, the number of mask processes and manufacturing costs are reduced. Also, if both electrodes of the capacitor are transparent electrodes, the aperture ratio of the flat panel display device may be increased without reducing the size of the capacitor. Also, since a wiring coupled to the capacitor is formed of the same material as that of a gate electrode having low resistance, thus, wiring resistance may be reduced.

Here, although the LCD device is shown in FIG. 8, the embodiments of the present invention are not limited thereto, and various display devices, e.g., an organic light-emitting display device, may be formed.

Since elements illustrated in the drawings may be enlarged or reduced for the convenience of explanation, the present invention is not limited to the sizes or shapes of the elements shown in the drawings. It will be understood by one of ordinary skill in the art that various modifications and equivalents may be made herein. Accordingly, the spirit and scope of the present invention should be defined by the appended claims and their equivalents.

What is claimed is:

1. A flat panel display device comprising:
   a semiconductor layer of a thin film transistor (TFT) on a substrate, the semiconductor layer comprising a channel region, a source region, and a drain region;
   a gate electrode on the channel region with a gate insulating layer between the gate electrode and the channel region;
   a capacitor on the gate insulating layer and comprising a first conductive layer, a first insulating layer, and a second conductive layer of which etched side surfaces are aligned;
   source and drain electrodes passing through a second insulating layer on the gate electrode and the capacitor, the source electrode contacting the source region and the drain electrode contacting drain region, one of the source electrode and drain electrode contacting the second conductive layer; and
   a pixel electrode contacting a portion of one of the source and drain electrodes.

2. The flat panel display device of claim 1, wherein the source and drain regions comprise same ion impurities.

3. The flat panel display device of claim 1, further comprising a wiring formed of a same material as that of the gate electrode, the wiring being on the gate insulating layer on which the gate electrode is formed and directly contacting the first conductive layer.

4. The flat panel display device of claim 3, wherein the wiring comprises at least one conductive material selected from the group consisting of silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), molybdenum (Mo), titanium (Ti), tungsten (W), molybdenum tungsten (MoW), aluminum/copper (Al/Cu), and combinations thereof.

5. The flat panel display device of claim 1, wherein each of the first conductive layer and the second conductive layer of the capacitor comprises a transparent conductive material.

6. The flat panel display device of claim 5, wherein the transparent conductive material comprises at least one material selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

7. The flat panel display device of claim 1, wherein the first insulating layer comprises a material having a dielectric constant higher than that of the second insulating layer.

8. The flat panel display device of claim 1, wherein the first insulating layer comprises a nitride.

9. The flat panel display device of claim 1, wherein the first insulating layer is only between the first conductive layer and the second conductive layer.

10. The flat panel display device of claim 1, further comprising an organic layer between the source and drain electrodes and the pixel electrode,
    wherein one of the source and drain electrodes contacts the pixel electrode through a via-hole in the organic layer.

11. The flat panel display device of claim 1, further comprising:
    a counter electrode facing the pixel electrode; and
    a liquid crystal layer between the pixel electrode and the counter electrode.

12. The flat panel display device of claim 1, further comprising a wiring formed of a same material as that of the gate electrode, the wiring being on the gate insulating layer on which the gate electrode is formed and directly contacting the first conductive layer,
    wherein the wiring is for receiving a voltage Vcom.

13. The flat panel display device of claim 1, further comprising:
    a counter electrode facing the pixel electrode; and
    an organic light-emitting layer between the pixel electrode and the counter electrode.

* * * * *